United States Patent
Schneider

(10) Patent No.: US 7,830,283 B2
(45) Date of Patent: Nov. 9, 2010

(54) COMPACT ENCODING OF SMALL INTEGERS

(75) Inventor: James Paul Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 73 days.

(21) Appl. No.: 12/395,474

(22) Filed: Feb. 27, 2009

(65) Prior Publication Data

US 2010/0219990 A1 Sep. 2, 2010

(51) Int. Cl.
H03M 7/00 (2006.01)
(52) U.S. Cl. .......................................... 341/106; 341/50
(58) Field of Classification Search .................. 341/106, 341/50, 59, 60, 107, 87; 382/244, 245, 246, 382/247, 248, 249, 250, 251; 375/240.02, 375/240.03, 240.11
See application file for complete search history.

(56) References Cited

U.S. PATENT DOCUMENTS 5,892,960 A * 4/1999 Seide ............................. 712/7

\* cited by examiner

*Primary Examiner*—Rexford N Barnie
*Assistant Examiner*—Joseph Lauture
(74) *Attorney, Agent, or Firm*—Blakely, Sokoloff, Taylor & Zafman LLP

(57) ABSTRACT

A method and apparatus for encoding a set of integers is described. The largest power of two integer is determined based on a size of the set of integers with an integer encoder. A code table is constructed using the largest power of two integer. A uniform coding is constructed with values from the code table. A string "1" is prepended to each code from the code table. The string "1" is appended to a string "0" from the code table.

20 Claims, 3 Drawing Sheets

COMPACT ENCODING OF SMALL INTEGERS

TECHNICAL FIELD

Embodiments of the present invention relate to data compression, and more particularly, to improving the compression ratio of a compression algorithm.

BACKGROUND

Data compression or source coding is the process of encoding information using fewer bits than an unencoded representation would use through use of specific encoding schemes. As with any communication, compressed data communication only works when both the sender and receiver of the information understand the encoding scheme.

Dictionary-based encoding systems typically involve an encoding algorithm for encoding an input stream that avoids duplication by producing an encoded stream that assigns codes to input strings that are repeated in the input stream. The decoding system typically applies the same algorithm in the reverse order to decode the encoded stream to provide a decoded output stream. Conventional dictionary-based systems typically output codes that are generally all of one or two fixed lengths, or a length that depends on the size of the input processed so far.

BRIEF DESCRIPTION OF THE DRAWINGS

The present invention is illustrated by way of example, and not by way of limitation, in the figures of the accompanying drawings and in which.

DETAILED DESCRIPTION

Described herein is a method and apparatus for encoding a set of integers is described. The largest power of two integer is determined based on a size of the set of integers with an integer encoder. A code table is constructed using the largest power of two integer. A uniform coding is constructed with values from the code table. A string "1" is prepended to each code from the code table. The string "1" is appended to a string "0" from the code table.

Figure 1:
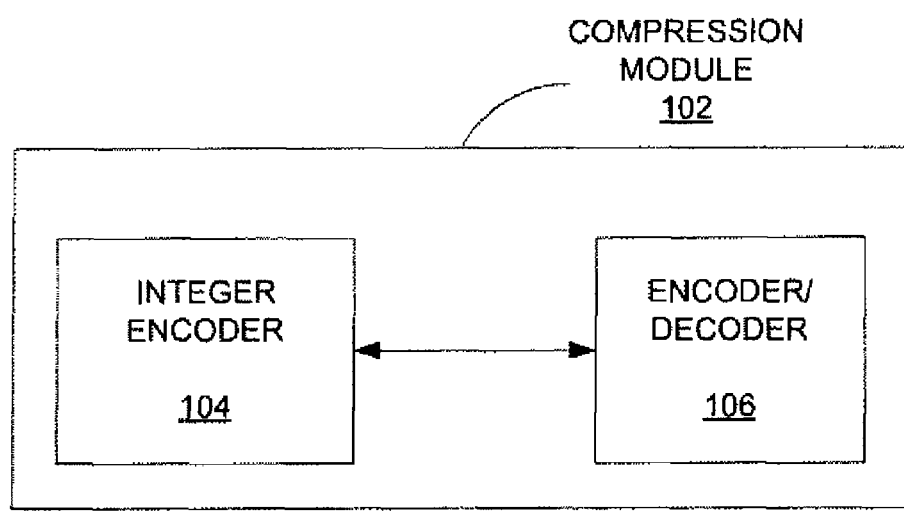
FIG. 1 is a block diagram illustrating one embodiment of a compressor.

FIG. 1 is a block diagram illustrating a dictionary-based compressor 102. In one embodiment, dictionary-based compressor 102 includes an encoder/decoder module 104, and an integer encoder module 106. Encoder/decoder module 104 is coupled to integer encoder module 106. Encoder/decoder module 104 processes each character in the input string sequentially. In one embodiment, the encoder/decoder module 104 involves a technique that would generate integers from known, small ranges. If there is no useful way to determine the occurrence probability of the members of this range, they are typically encoded by using the number of bits required to encode the largest value in the range. As such, encoding values in the range 0-18 would need 5 bits. For example, this is the type of coding used in LZW compression algorithm.

This type of coding is fast and simple, but not quite as bit efficient as it could be. For example, coding from the set 0-18, the theoretical minimum bit encoding is about 4.17 bits per item, assuming uniformly distributed values, if a fractional bit coding scheme is used.

In cases where fractional bit coding is undesirable, it is still possible to reduce the average number of bits required to code these values, with a code table constructed for the size of the set being represented (call the size "k"). The operation of the integer encoder module 106 is described in more detail below with respect to FIG. 2.

Figure 2:
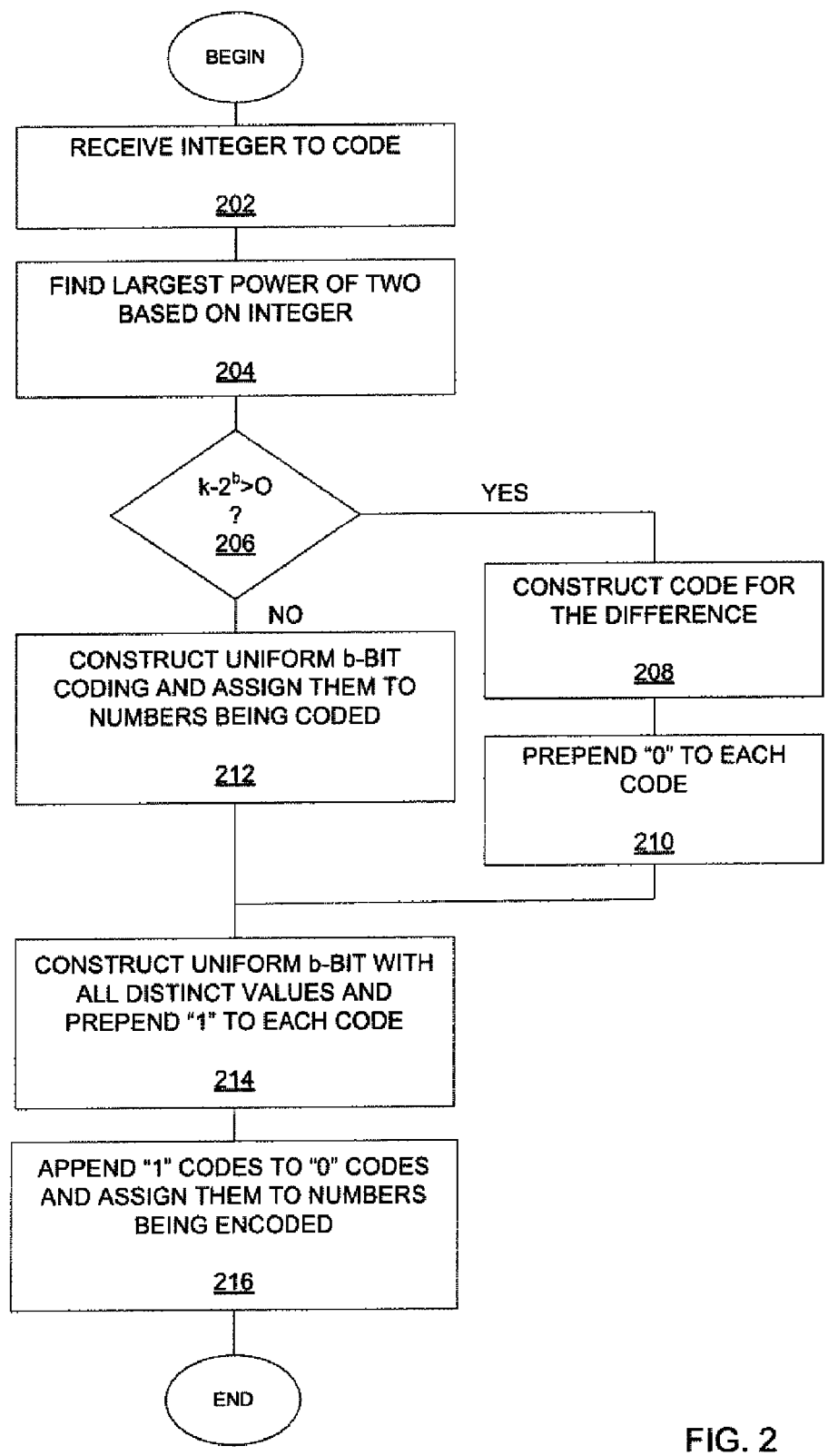
FIG. 2 is a flow diagram illustrating one embodiment of a method for encoding integers.

FIG. 2 is a flow diagram illustrating one embodiment of a method for encoding integers. At 202, an integer k to code is received. The integer k is typically associated with the size of a code table. At 204, the largest power of 2 of the integer k, called b, is determined such that $2b<=k<2b+1$. At 206, if $k-2b>0$, the codes for the difference are constructed at 208. At 210, the string "0" is prepended to each code. Otherwise at 212, a uniform b-bit coding with all distinct values is constructed. At 214, a uniform b-bit coding with all distinct values is constructed. The string "1" is prepended to each code. At 216, the "1" codes are appended to the "0" codes and assigned to the numbers being encoded.

The above coding process produces codes that are no longer than a coding that uses the same (integral) number of bits for each. The following example illustrates the construction of a coding table for the set of 0-18:

In a first step, the integer encoder constructs a code table for k=19, b=4, $k-2^b=3$. In a second step, the integer encoder constructs a code table for k=3; b=1, $k-2^b=1$. In a third step, the integer encoder constructs a code table for k=1 and a single code of " ". In a fourth step, the integer encoder then prepends "0" to the codes from the third step, now a single code of "0". In a fifth step, the integer encoder constructs a uniform 1-bit coding, prepending 1: "10", "11". In a sixth step, the two code tables are concatenated: "0", "10", "11". In a seventh step, the integer encoder prepends 0 to the codes from step 6: "00", "010", "011". In a final step, the integer encoder constructs a 4-bit coding, prepending 1: "10000", "10001", . . . "11111". The result is the following code table:

| 0  | 00    |
|----|-------|
| 1  | 010   |
| 2  | 011   |
| 3  | 10000 |
| 4  | 10001 |
| 5  | 10010 |
| 6  | 10011 |
| 7  | 10100 |
| 8  | 10101 |
| 9  | 10110 |
| 10 | 10111 |
| 11 | 11000 |
| 12 | 11001 |
| 13 | 11010 |
| 14 | 11011 |
| 15 | 11100 |
| 16 | 11101 |
| 17 | 11110 |
| 18 | 11111 |

If the values 0-18 are uniformly distributed, this coding requires 4.63 bits on average. If lower values are more likely than higher values, this coding will do better on average, to a theoretical minimum of 2 bits per code. If higher values are more likely than lower values, this coding will do worse on average, to a theoretical maximum of 5 bits per code. An alternative coding can be constructed using the Huffman code construction process, with equal probabilities to each number. This construction produces a coding for 0-18 of the following table:

| | |
|---|---|
| 0 | 0000 |
| 1 | 0001 |
| 2 | 0010 |
| 3 | 0011 |
| 4 | 0100 |
| 5 | 0101 |
| 6 | 0110 |
| 7 | 0111 |
| 8 | 1000 |
| 9 | 1001 |
| 10 | 1010 |
| 11 | 1011 |
| 12 | 11000 |
| 13 | 11001 |
| 14 | 11010 |
| 15 | 11011 |
| 16 | 11100 |
| 17 | 11101 |
| 18 | 1111 |

The Huffman coding table produces codes with an average length of 4.32 bits, and a maximum bit length of 5. However, the minimum bit length of these codes is 4, so a sequence that is biased towards zero will still require at least 4 bits per code. In other words, it may not be optimal in the case of a distribution with a hard to quantify, but definitely present, bias towards small values.

This coding can also be extended to code a sequence of non-repeating small integers. In one embodiment, such sequences can be coded by presenting an integer representing the smallest value in the sequence, using the number of bits required for the largest possible integer in the set, (so, if the set represents 8-bit octets, this would be 8 bits), an integer representing the least power of two greater than the difference between the smallest and the largest integers (in the example case, this would be an integer in the range 1-8, which can be represented in 3 bits), and as many differences as there are members in the sequence, coded from a set of indexes into a shrinking table. For example, the sequence "abrcd" could be coded with an 8-bit value of 97 (0x61 hex), representing the lowest value in the sequence, a 3-bit value 4, representing the number 32 (the lowest power of 2 greater than the difference between the least value, 97, and the largest value, 114), and the five bit values 0, 0, 15, 0, 0, representing the indexes into tables of 32, 31, 30, 29, and 28 entries where the next difference was found. This would take 36 bits.

This can be modified by presenting the smallest value from the sequence using as many bits as would be necessary for the largest member of the set. This is followed by the difference between the largest and smallest element, the number of differences, and the index of the differences in the shrinking difference table, each value being coded from a code table constructed as above. For the example string "abrcd", the first value would be 97 decimal, coded in 8 bits as 0110001. The second value would be 17, coded using the coding table with 158 entries, which is the 6-bit string 010011. The next value is 0, coded from a coding table with 18 entries, which is the two-bit string 00. The next value is 0, coded from a coding table with 17 entries, which is the single bit 0. The next value is 15, coded from a coding table with 16 entries, which is 1111. The next value is 0, coded from a coding table with 15 entries, which is the bit string 00. The final 0 is coded from a table with 14 entries, giving a final bit string of 00. The entire coding is 0110 0001 0100 1100 0111 1000 0, or 25 bits. If the number of entries in the sequence also needed to be included (which may be the case if the sequence is not delimited some way), this can be handled by including the count after the maximum difference, encoded using a table constructed with the same number of entries as the maximum difference (so, 17 in the example case—the count of 5 would be encoded as the five-bit string 10011, making the string 30 bits long).

As such, the integer encoder as described above provides a more compact encoding that takes advantage of biases towards low numbers in a sequence, with a guarantee that it will not take more bits than coding each element using a constant bit string length.

Figure 3:
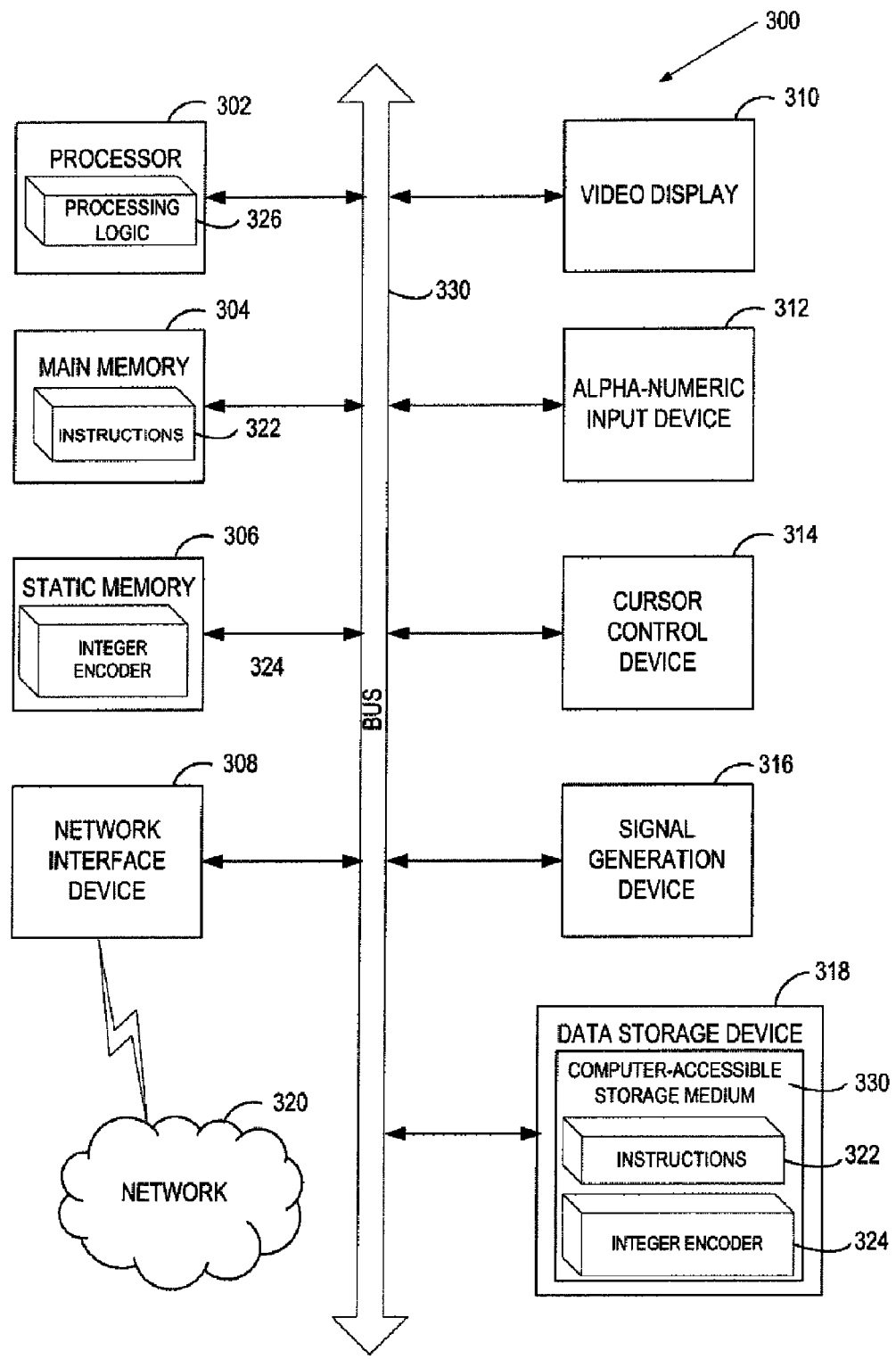
FIG. 3 is a block diagram of an exemplary computer system.

FIG. 3 illustrates a diagrammatic representation of a machine in the exemplary form of a computer system 300 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 300 includes a processing device 302, a main memory 304 (e.g., read-only memory (ROM), flash memory, dynamic random access memory (DRAM) such as synchronous DRAM (SDRAM), a static memory 306 (e.g., flash memory, static random access memory (SRAM), etc.), and a data storage device 318, which communicate with each other via a bus 330.

Processing device 302 represents one or more general-purpose processing devices such as a microprocessor, central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 302 may also be one or more special-purpose processing devices such as an application specific integrated circuit (ASIC), a field programmable gate array (FPGA), a digital signal processor (DSP), network processor, or the like. The processing device 302 is configured to execute the processing logic 326 for performing the operations and steps discussed herein.

The computer system 300 may further include a network interface device 308. The computer system 300 also may include a video display unit 310 (e.g., a liquid crystal display (LCD) or a cathode ray tube (CRT)), an alphanumeric input device 312 (e.g., a keyboard), a cursor control device 314 (e.g., a mouse), and a signal generation device 316 (e.g., a speaker).

The data storage device 318 may include a machine-accessible storage medium 330 on which is stored one or more sets of instructions (e.g., software 322) embodying any one or more of the methodologies or functions described herein. The software 322 may also reside, completely or at least partially, within the main memory 304 and/or within the processing device 302 during execution thereof by the computer system 300, the main memory 304 and the processing device 302 also constituting machine-accessible storage media. The software 322 may further be transmitted or received over a network 320 via the network interface device 308.

The machine-accessible storage medium 330 may also be used to store an encoding algorithm 324 as presently described. The encoding algorithm 324 may also be stored in other sections of computer system 300, such as static memory 306.

While the machine-accessible storage medium 330 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instructions for execution by the machine and that cause the machine to perform any one or more of the methodologies of the present invention. The term "machine-accessible storage medium" shall accordingly be taken to include, but not be limited to, solid-state memories, optical and magnetic media, and carrier wave signals.

In the above description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method for encoding a set of integers comprising:
   determining the largest power of two integer based on a size of the set of integers with an integer encoder;
   constructing a code table using the largest power of two integer; and
   constructing a uniform coding with values from the code table.

2. The computer-implemented method of claim 1 further comprising:
   prepending a string "1" to each code from the code table; and
   appending the string "1" to a string "0" from the code table.

3. The computer-implemented method of claim 2 further comprising:
   constructing a zero-length code of " " when the largest power of two integer is zero.

4. The computer-implemented method of claim 2 further comprising:
   incorporating the generated encoded set of integers for LZW compression algorithm.

5. The computer-implemented method of claim 1 wherein the largest power of two integer is determined such that:
   $2^b <= k < 2^{b+1}$,
   wherein b is the largest power of two integer and k is the size of the set of integers.

6. The computer-implemented method of claim 1 further comprising:
   constructing the code table for the difference, and prepending the string "0" to each code when $k-2^b > 0$;
   constructing a uniform b-bit coding with all distinct values of the set of integers, and assigning the distinct values to the set of integers being encoded when $k-2^b <= 0$.

7. The computer-implemented method of claim 1 further comprising:
   incorporating the generated encoded set of integers for LZW compression algorithm.

8. The computer-accessible storage medium of claim 7 wherein the method further comprises:

incorporating the generated encoded set of integers for LZW compression algorithm.

9. The computer-accessible storage medium of claim 7 wherein the method further comprises:
incorporating the generated encoded set of integers for LZW compression algorithm.

10. A computer-accessible storage medium including data that, when accessed by a computer system, cause the computer system to perform a method for encoding a set of integers comprising:
determining the largest power of two integer based on a size of the set of integers;
constructing a code table using the largest power of two integer; and
constructing a uniform coding with values from the code table.

11. The computer-accessible storage medium of claim 10 wherein the method further comprises:
prepending a string "1" to each code from the code table; and
appending the string "1" to a string "0" from the code table.

12. The computer-accessible storage medium of claim 11 wherein the method further comprises:
constructing a zero-length code of " " when the largest power of two integer is zero.

13. The computer-accessible storage medium of claim 10 wherein the largest power of two integer is determined such that:

$$2^b <= k < 2^{b+1},$$

wherein b is the largest power of two integer and k is the size of the set of integers.

14. The computer-accessible storage medium of claim 10 wherein the method further comprises:
constructing the code table for the difference, and prepending the string "0" to each code when $k-2^b>0$;
constructing a uniform b-bit coding with all distinct values of the set of integers, and assigning the distinct values to the set of integers being encoded when $k-2^b<=0$.

15. An apparatus for encoding a set of integers comprising:
an integer encoder module configured to determine the largest power of two integer based on a size of the set of integers with an integer encoder, to construct a code table using the largest power of two integer, and to construct a uniform coding with values from the code table; and
an encoder module coupled to the integer encoder module, the encoder module configured to encode an input string of data based on the encoded set of integers.

16. The apparatus of claim 15 wherein the integer encoder module is configured to prepend a string "1" to each code from the code table, and to append the string "1" to a string "0" from the code table.

17. The apparatus of claim 16 wherein the integer encoder module is configured to construct a zero-length code of " " when the largest power of two integer is zero.

18. The apparatus of claim 16 wherein the encoder module includes a LZW compression algorithm.

19. The apparatus of claim 15 wherein the largest power of two integer is determined such that:

$$2^b <= k < 2^{b+1},$$

wherein b is the largest power of two integer and k is the size of the set of integers.

20. The apparatus of claim 15 wherein the integer encoder module is configured to construct the code table for the difference, and prepending the string "0" to each code when $k-2^b>0$, and to construct a uniform b-bit coding with all distinct values of the set of integers, and assigning the distinct values to the set of integers being encoded when $k-2^b<=0$.

* * * * *